US012787303B2

(12) United States Patent
Zhao et al.

(10) Patent No.: US 12,787,303 B2

(45) Date of Patent: Nov. 3, 2026

(54) SINGLE PLUG FLOW FOR A MEMORY DEVICE

(71) Applicant: Micron Technology, Inc., Boise, ID (US)

(72) Inventors: Zhao Zhao, Meridian, ID (US); Trevor J. Plaisted, Boise, ID (US); Stephen W. Russell, Boise, ID (US); Farrell M. Good, Meridian, ID (US); Sangeetha P. Komanduri, Boise, ID (US); Sandra L Tagg, Boise, ID (US); Nathan A. Wilkerson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 365 days.

(21) Appl. No.: 18/391,122

(22) Filed: Dec. 20, 2023

(65) Prior Publication Data

US 2024/0215268 A1 Jun. 27, 2024

Related U.S. Application Data

(60) Provisional application No. 63/476,790, filed on Dec. 22, 2022.

(51) Int. Cl.

*H10B 63/00* (2023.01)

*H10B 63/10* (2023.01)

(52) U.S. Cl.

CPC ........... *H10B 63/845* (2023.02); *H10B 63/10* (2023.02)

(58) Field of Classification Search

CPC ...... H10B 63/845; H10B 63/10; H10N 70/20; H10N 70/231; H10N 70/823; H10N 70/8825

See application file for complete search history.

(56) References Cited

U.S. PATENT DOCUMENTS

| | | | |
|---|---|---|---|
| 9,530,824 B2 | 12/2016 | Takaki et al. | |
| 2016/0268340 A1 | 9/2016 | Shimabukuro et al. | |
| 2022/0180926 A1 | 6/2022 | Villa et al. | |
| 2022/0238550 A1 | 7/2022 | Shin | |
| 2023/0329010 A1 * | 10/2023 | Pellizzer ................ | H10B 63/34 257/5 |

FOREIGN PATENT DOCUMENTS

KR 10-2014-0086640 A 7/2014

OTHER PUBLICATIONS

"International Search Report and Written Opinion of the International Searching Authority," issued in connection with Int'l Appl. No. PCT/US2023/85332, dated Apr. 25, 2024 (9 pages).

* cited by examiner

*Primary Examiner* — Matthew L Reames

(74) *Attorney, Agent, or Firm* — Holland & Hart LLP

(57) ABSTRACT

Methods, systems, and devices for a single plug flow for a memory device are described. In some examples, the memory device may include one or more plugs formed above respective bit line plates. The plugs may include a liner and one or more sacrificial materials that are removed during a subsequent etching operation. Accordingly, pillars may be formed above the plugs, and may be generally aligned with the respective bit line plates.

20 Claims, 13 Drawing Sheets

SINGLE PLUG FLOW FOR A MEMORY DEVICE

CROSS REFERENCE

The present Application for Patent claims priority to U.S. Patent Application No. 63/476,790 by Zhao et al., entitled "SINGLE PLUG FLOW FOR A MEMORY DEVICE," filed Dec. 22, 2022, which is assigned to the assignee hereof, and which is expressly incorporated by reference in its entirety herein.

TECHNICAL FIELD

The following relates to one or more systems for memory, including a single plug flow for a memory device.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
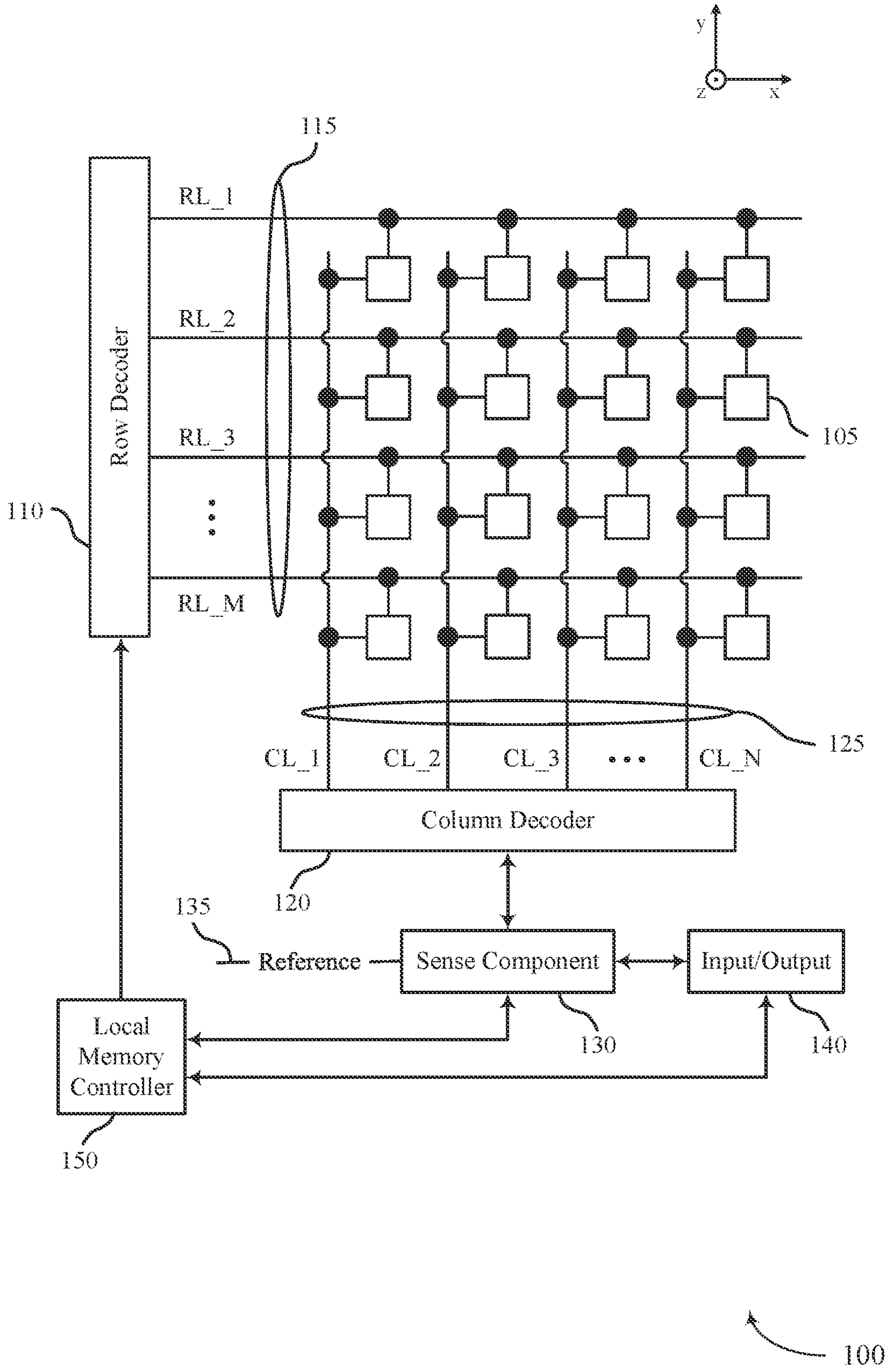
FIG. 1 illustrates an example of a memory array that supports a single plug flow for a memory device in accordance with examples as disclosed herein.

A memory device may include a vertical architecture that includes pillars coupled with bit line plates (e.g., below the pillars). The bit line plates may be activated to select a pillar (e.g., during an access operation) to perform operations on memory cells associated with the respective pillars. The vertical architecture may also include piers which may function as access regions for manufacturing operations for forming the memory cells. In some cases, forming the pillars and piers may include removing portions of materials via an etching operation that extends a distance (e.g., through a stack of materials) down to the bit line plates. However, in such cases, it may be desirable to stop the etching operation before reaching the bit line plates to prevent or mitigate damage that the bit line plates would otherwise experience due to the etching operation. Further, it may be desirable to align the pillars with the bit line plates to prevent electrical faults (e.g., shorts or opens) from occurring.

Accordingly, some vertical architectures may include one or more plugs (e.g., pillar plugs, pier plugs). For example, the pillar plugs may protect the bit line plates during an etching operation, and the pier plugs may be configured to prevent accidental removal of material during the etching operation. In some cases, the pillar plugs and pier plugs may be formed with different materials such that the pillar plugs and pier plugs may not be removed by a same etching operation. However, implementing such plugs in a vertical architecture may cause shorting between the pillars and piers due to size constraints of the memory device. Moreover, in the absence of pier plugs, the pillar plugs may not be in contact with pier plugs, which may prevent electrical shorts between pillars.

A plug flow that prevents or mitigates damage to bit line plates and prevents or mitigates the occurrence of electrical shorts is described herein. In some examples, the plugs described herein may be formed to prevent an etching operation from adversely contacting one or more bit line plates during a manufacturing operation. For example, a process for forming pillars and the piers of a memory device may include forming sacrificial pillar plugs above the bit line plates, where the pillar plugs may include a liner and a sacrificial material that may be removed during the etching operation. In some cases, the liner may protect the bit line plates during the etching operation and may result in the pillars being generally aligned with the bit line plates. Moreover, the associated manufacturing operation may be simplified by reducing the quantity of processing steps, the quantities of materials (e.g., etchants, dielectrics, etc.) used, or both, that would otherwise be incurred.

Features of the disclosure are initially described in the context of memory devices and arrays with reference to FIGS. 1, 2, 3A, and 3B. Features of the disclosure are described in the context of processing steps with reference to FIGS. 4A thru 4F and 5A thru 5H. These and other features of the disclosure are further illustrated by and described with reference to a flowchart that relates to a single plug flow for a memory device as described with reference to FIG. 6.

FIG. 1 illustrates an example of a memory device 100 that supports a single plug flow for a memory device in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

In accordance with examples as described herein, plugs may be implemented at the memory device 100 to prevent an etching associated with forming the access lines (e.g., the row lines 115 or the column lines 125) from adversely contacting the decoders (e.g., the row decoders 110 or the column decoders 120), from creating electrical shorts between row lines 115, or both. For example, a process for forming the access lines may include forming sacrificial plugs above the decoders, where the plugs may include a liner and a sacrificial material that may be removed during an etching operation. In some cases, the liner may protect the decoders during the etching operation and may allow for the resulting pillar to be generally aligned with a respective decoder. Moreover, the associated manufacturing operation may be simplified by reducing the quantity of processing steps, the quantities of materials (e.g., etchants, dielectrics, etc.) used, or both, that would otherwise be incurred when manufacturing the memory device 100.

Figure 2:
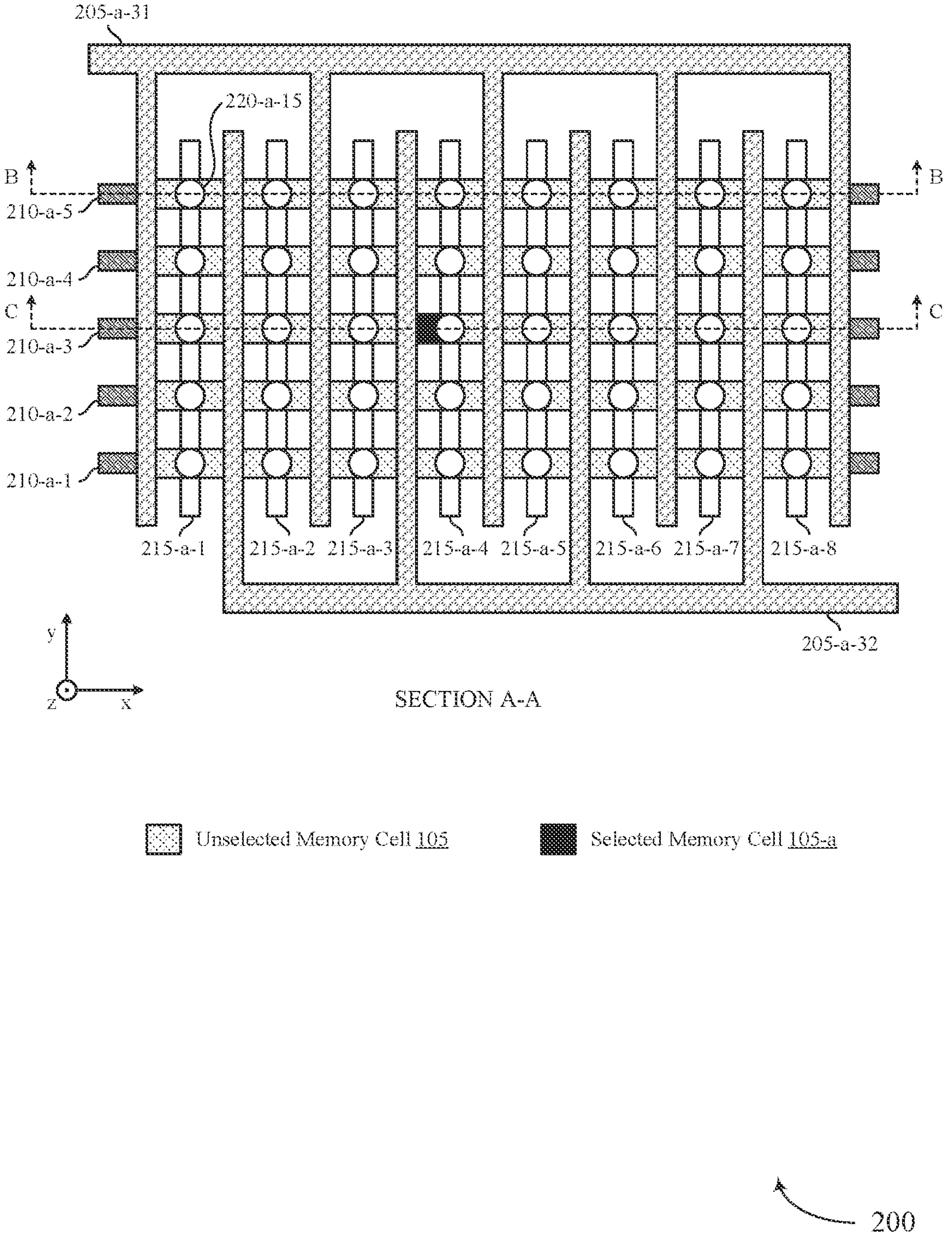
FIG. 2 illustrates a top view of an example of a memory array that supports a single plug flow for a memory device in accordance with examples as disclosed herein.
Figure 3A:
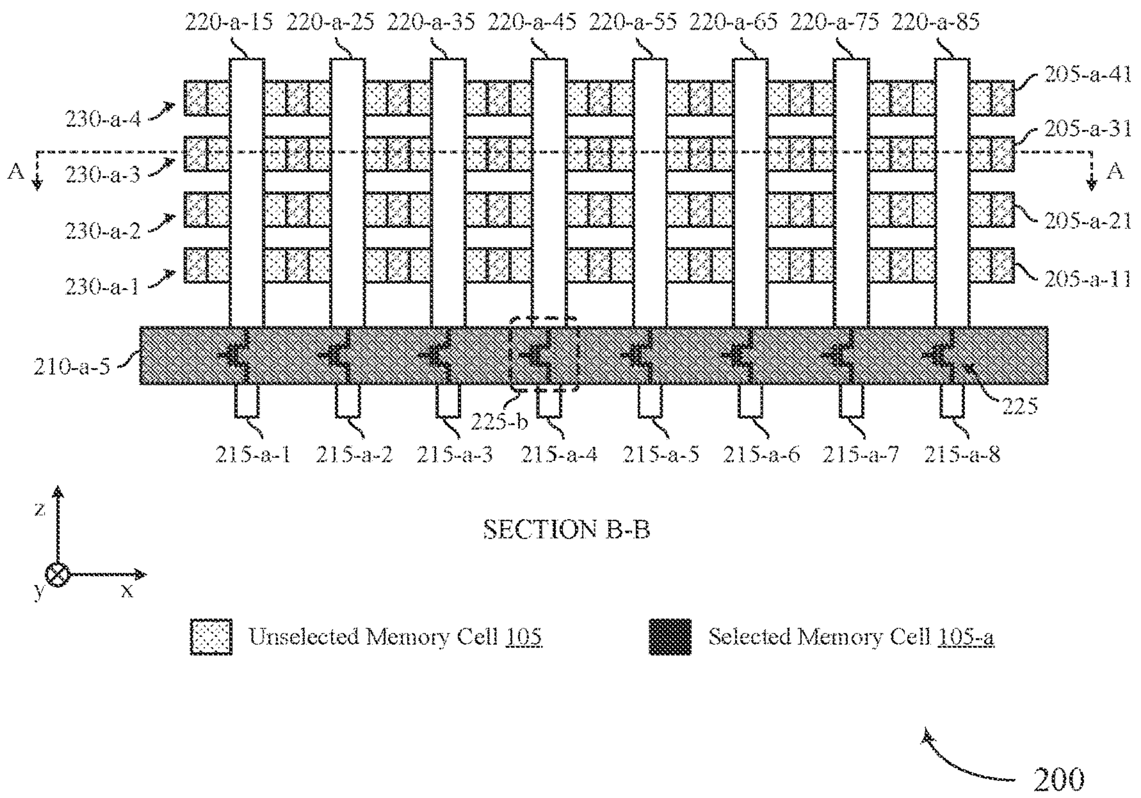
FIGS. 3A and 3B illustrate side views of an example of a memory array that supports a single plug flow for a memory device in accordance with examples as disclosed herein.
Figure 3B:
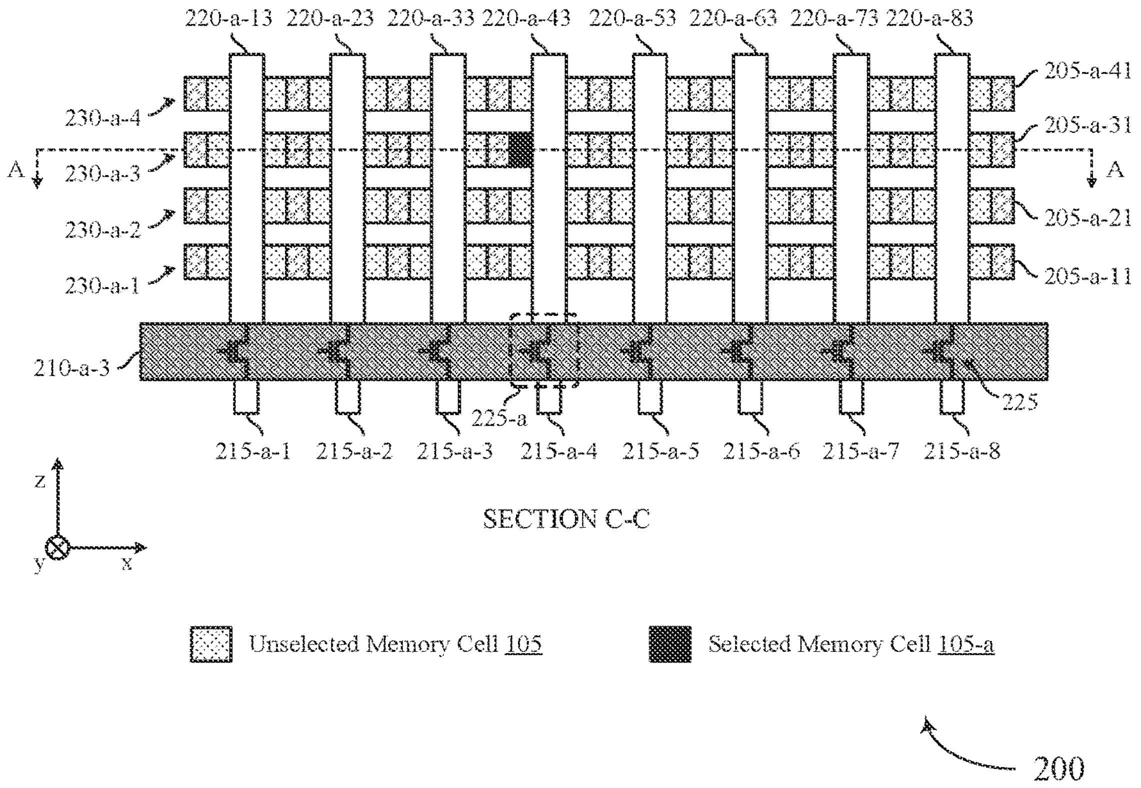

FIGS. 2, 3A, and 3B illustrate an example of a memory array 200 that supports a single plug flow for a memory device in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-*a*-n1 and even word lines 205-*a*-n2 for a given level, n), where such word lines 205 of the same level 230 may be described as being interleaved (e.g., with portions of an odd word line 205-*a*-n1 projecting along the y-direction between portions of an even word line 205-*a*-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-*a* of the level 230-*a*-3 may be accessed according to an intersection between the pillar 220-*a*-43 and the word line 205-*a*-32.

In some examples, a plug may be formed above a respective bit line plate before forming the pillars 220. For example, the plugs may be formed using a plug flow that prevents or mitigates damage to bit line plates and prevents or mitigates the occurrence of electrical shorts. In some examples, the plugs described herein may be formed to prevent an etching operation from adversely contacting one or more bit line plates during a manufacturing operation. For example, a process for forming the pillars 220 may include forming sacrificial pillar plugs above the bit line plates, where the pillar plugs may include a liner and a sacrificial material that may be removed during the etching operation. In some cases, the liner may protect the bit line plates during the etching operation and may result in the pillars 220 being generally aligned with the bit line plates. Moreover, the associated manufacturing operation may be simplified by reducing the quantity of processing steps, the quantities of materials (e.g., etchants, dielectrics, etc.) used, or both, that would otherwise be incurred.

FIGS. 4A through 4F illustrate examples of processing steps 400 that support a single plug flow for a memory device in accordance with examples as disclosed herein. The processing steps 400 may illustrate one or more manufacturing operations for fabricating aspects of memory device 100 or memory array 200, as described with reference to FIGS. 1 and 2 through 3B, respectively. For illustrative purposes, aspects of the memory device may be described with reference to an x-direction, a y-direction (e.g., into the page), and a z-direction of the illustrated coordinate system. For example, the processing steps 400 may illustrate various cross-sectional views of the memory device in an xz-plane. In some examples, the z-direction may be illustrative of a direction (e.g., a vertical direction, a layer direction) orthogonal to a surface of a substrate (e.g., a surface in an xy-plane, a surface upon or over which other materials may be deposited), and each of the related regions, illustrated by their respective cross section in the xz-plane, may extend for some distance along the y-direction (e.g., above or on the substrate). Reference to relative directions such as "up," "above," "below," or "down" may refer to directions along the y-direction (e.g., "up" or "above" may be in the positive z-direction and "down" or "below" may be in the negative z-direction). Although the processing steps 400 illustrate examples of relative dimensions and quantities of various features, aspects of the memory device may be implemented with other relative dimensions or quantities of such features in accordance with examples as disclosed herein.

Operations illustrated in and described with reference to FIGS. 4A through 4F may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein. As described herein, plugs (e.g., pillar plugs) may be formed within a stack of materials to prevent or mitigate electrical shorts otherwise caused by misalignment of the pillars. Moreover, the materials and processing steps used to form the plugs may mitigate or prevent damage to bit line plates of the memory device that may otherwise occur.

Figure 4A:
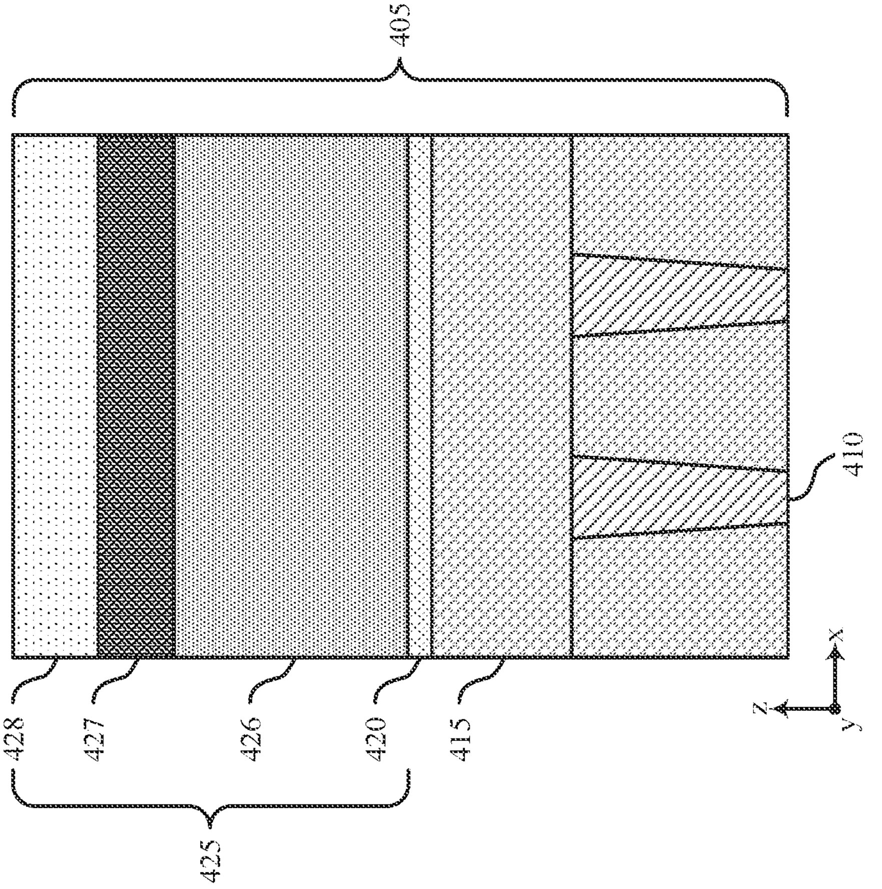
FIGS. 4A through 4F illustrate examples of processing steps that support a single plug flow for a memory device in accordance with examples as disclosed herein.

FIG. 4A illustrates a first processing step 400-*a* for forming a pillar plug stack 405. In some examples, the first processing step 400-*a* may include forming bit line plates 410 which may be configured for performing access operations on memory cells (e.g., chalcogenide memory cells; not shown). The bit line plates 410 may be a conductive material (e.g., a tungsten material) extending in the y-direction and may be coupled with one or more transistors (not shown) such as complementary metal-oxide semiconductor (CMOS) transistors, thin-film transistors (TFTs), or the like that are located below the pillar plug stack 405 (e.g., along the z-direction).

In some examples, the first processing step 400-*a* may also include forming layers of materials above the bit line plates 410. For example, a first dielectric material 415 may be deposited above the bit line plates 410 (e.g., along the z-direction), where the first dielectric material 415 may be an oxide material (e.g., tetraethyl orthosilicate (TEOS)). In some implementations, a planarization stop material 420 may be deposited above the first dielectric material 415 (e.g., along the z-direction), where the planarization stop material 420 may be a polysilicon material. In some examples, the planarization stop material 420 may be resistant to a planarization operation. In some implementations, a hard mask 425 may be formed above the planarization stop material 420, where the hard mask 425 may include a first hard mask material 426, a second hard mask material 427, and a photoresist material 428. The first dielectric material 415, the planarization stop material 420, and the hard mask 425 may be formed such that each material is generally coplanar in an xy-plane, and the layers may be stacked in the z-direction (e.g., the layers may be deposited one above another in the z-direction). In some examples, the bit line plates 410 may be formed prior to depositing the first dielectric material 415 or may be formed in the first dielectric material 415.

Figure 4B:
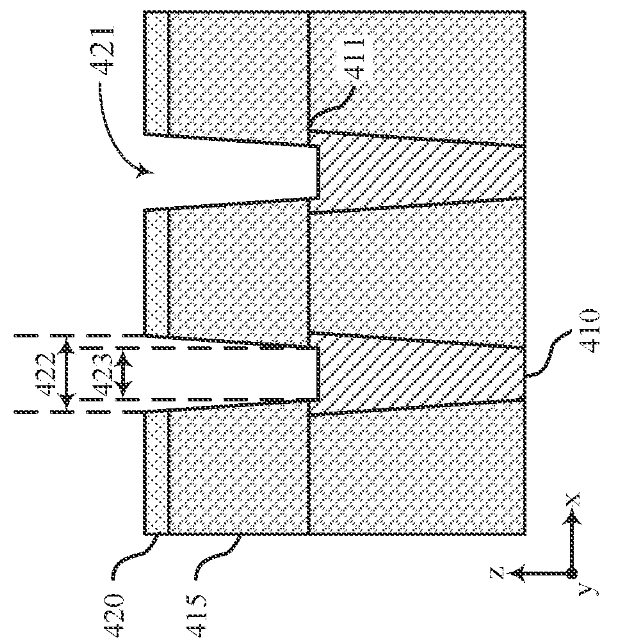

FIG. 4B illustrates a second processing step 400-*b* for forming cavities 421 in the first dielectric material 415 and the planarization stop material 420. For example, forming the cavities 421 may include removing portions of the first dielectric material 415 and the planarization stop material 420 via an etching operation (e.g., a dry etch operation). In some implementations, the cavities 421 may be aligned with the bit line plates 410 (e.g., in the x-direction) and may extend through the first dielectric material 415 (e.g., along the z-direction) and may contact an upper surface 411 of the bit line plates 410. In some instances, the cavities 421 may have a first width 422 (e.g., in the x-direction) at the upper region of the cavities 421 and a second width 423 at the lower region of the cavities 421. The second width 423 may be different than (e.g., less than) the first width 422.

Figure 4D:
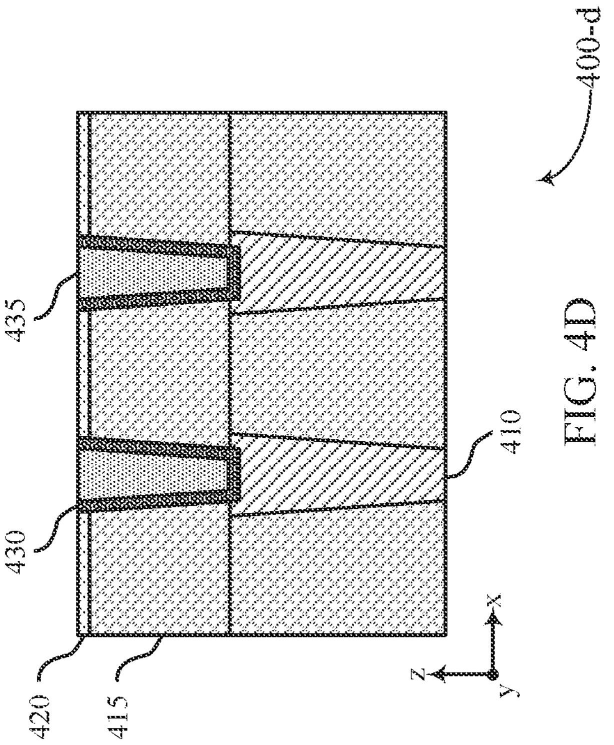
Figure 4C:
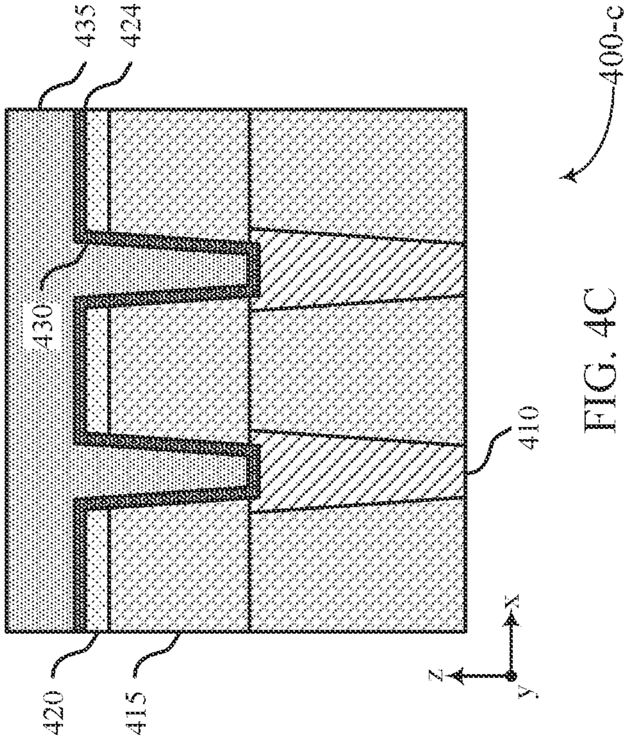

FIG. 4C illustrates a third processing step 400-*c* for depositing a liner 430 and a sacrificial material 435 in the cavities 421. For example, the liner 430 may be deposited in the cavities 421 such that it is in contact with an upper surface 411 of the bit line plates 410, and the sacrificial material 435 may be deposited to fill any remaining space in the cavities 421. In some implementations, the liner 430 and the sacrificial material 435 may be sequentially deposited onto the planarization stop material 420, such that the liner 430 may contact an upper surface 424 of the planarization stop material 420. The liner 430 may be a dielectric material (e.g., a fourth dielectric material), such as an oxide material, which is different than the oxide material of the first dielectric material 415, and may be resistant to wet etch operations (e.g., exhuming operations) that may otherwise remove the sacrificial material 435. The sacrificial material 435 may be an aluminum oxide material or another material (e.g., an exhumable material) that may be removable by a wet etching operation.

FIG. 4D illustrates a fourth processing step 400-*d* for planarizing the liner 430 and the sacrificial material 435. For example, a portion of the liner 430 and the sacrificial material 435 above the planarization stop material 420 (e.g., along the z-direction) may be removed. In some instances, a portion of the planarization stop material 420 may be removed during the planarization of the liner 430 and the sacrificial material 435. In some implementations, the planarization stop material 420 may prevent the removal of the first dielectric material 415.

Figure 4F:
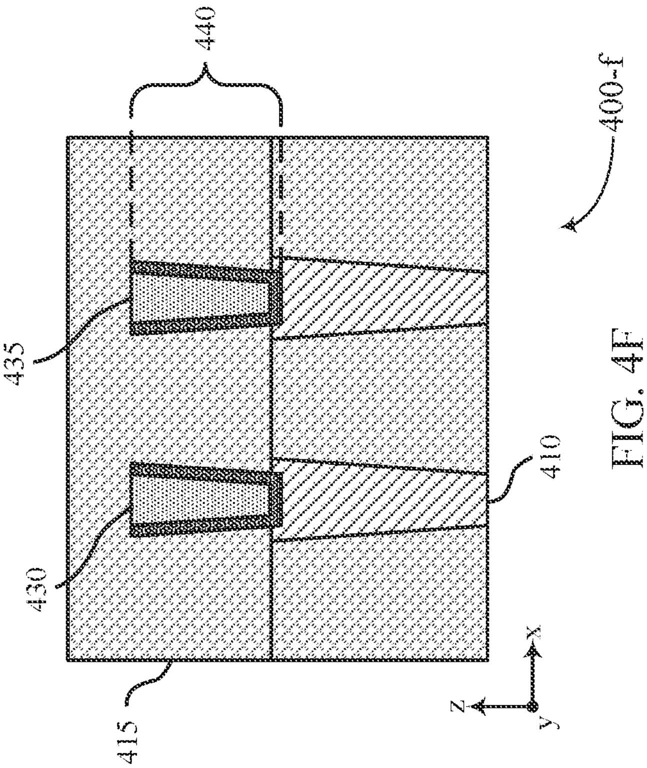
Figure 4E:
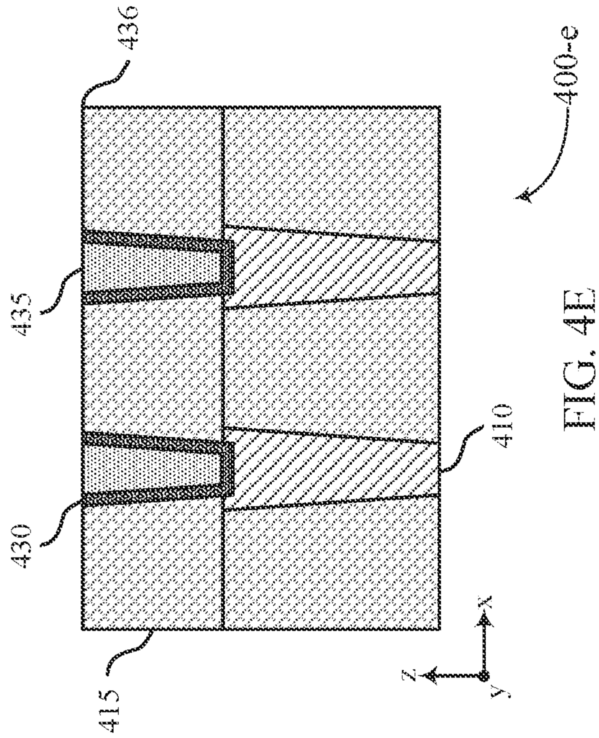

FIG. 4E illustrates a fifth processing step 400-*e* for removing the planarization stop material 420. In some examples, the fifth processing step 400-*e* may include planarizing the planarization stop material 420, the liner 430, and the sacrificial material 435 with a different planarization operation than performed in the fourth processing step 400-*d*. In some implementations, the planarizing may result in a coplanar upper surface 436 of the first dielectric material 415, the liner 430, and the sacrificial material 435.

FIG. 4F illustrates a sixth processing step 400-*f* for forming additional first dielectric material 415 (e.g., a fifth dielectric material). In some examples, the sixth processing step 400-*f* may include depositing the first dielectric material 415 on the upper surface 436 of the existing first dielectric material 415, the liner 430, and the sacrificial material 435. In some instances, the sixth processing step 400-*f* may include planarizing the additional first dielectric material 415.

In accordance with examples as disclosed herein, the processing steps 400 may form plugs 440, which may prevent or mitigate damage to the bit line plates 410 in subsequent manufacturing operations. For example, during the formation of one or more pillars, the plugs 440 may prevent the manufacturing operations for forming the pillars from adversely contacting (e.g., damaging) the bit line plates 410. Additionally, the manufacturing operations described herein with reference to FIGS. 4A through 4F may result in the plugs 440 being generally aligned with the bit line plates 410. Accordingly, the pillars may be generally aligned with the bit line plates 410, which may prevent or mitigate electrical faults (e.g., shorts or opens) that may otherwise occur.

FIG. 5A through 5H illustrate examples of processing steps 500 that support a single plug flow for a memory device in accordance with examples as disclosed herein. The processing steps 500 may illustrate aspects of a sequence of manufacturing operations for fabricating aspects of memory device 100 or memory array 200, as described with reference to FIGS. 1 and 2 through 3B, respectively. Further, the processing steps may illustrate a sequence of manufacturing operations subsequent to the processing steps 400, and may include aspects of the memory device as described with reference to FIGS. 4A through 4F.

For illustrative purposes, aspects of the memory device may be described with reference to an x-direction, a y-direction (e.g., into the page), and a z-direction of the illustrated coordinate system. For example, the processing steps 500 may illustrate various cross sectional views of the memory device in an xz plane. In some examples, the z direction may be illustrative of a direction (e.g., a vertical direction, a layer direction) orthogonal to a surface of a substrate (e.g., a surface in an xy plane, a surface upon or over which other materials may be deposited), and each of the related regions, illustrated by their respective cross section in the xz plane, may extend for some distance along the y direction (e.g., above or on the substrate). Although the processing steps 500 illustrate examples of relative dimensions and quantities of various features, aspects of the memory device may be implemented with other relative dimensions or quantities of such features in accordance with examples as disclosed herein.

Operations illustrated in and described with reference to FIGS. 5A through 5H may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein. As described herein, plugs (e.g., pillar plugs) may be formed within a stack of materials to prevent or mitigate electrical shorts otherwise caused by misalignment of the pillars. Moreover, the materials and processing steps used to form the plugs may mitigate or prevent damage to bit line plates of the memory device that may otherwise occur.

Figure 5B:
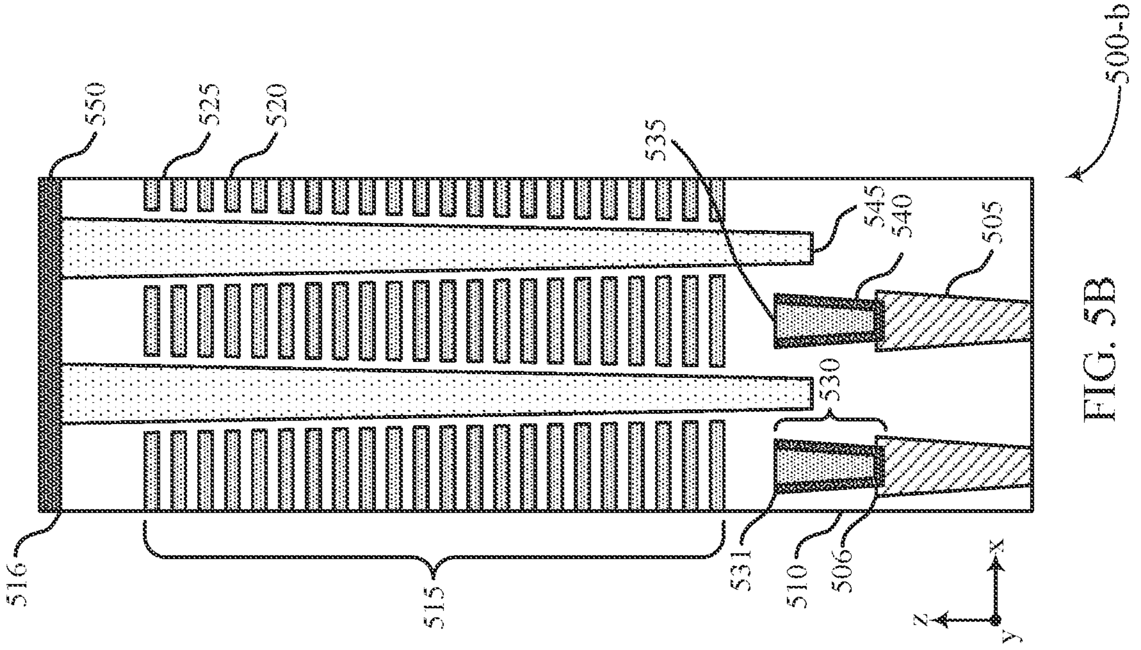
FIG. 5A through 5H illustrate examples of processing steps that support a single plug flow for a memory device in accordance with examples as disclosed herein.
Figure 5A:
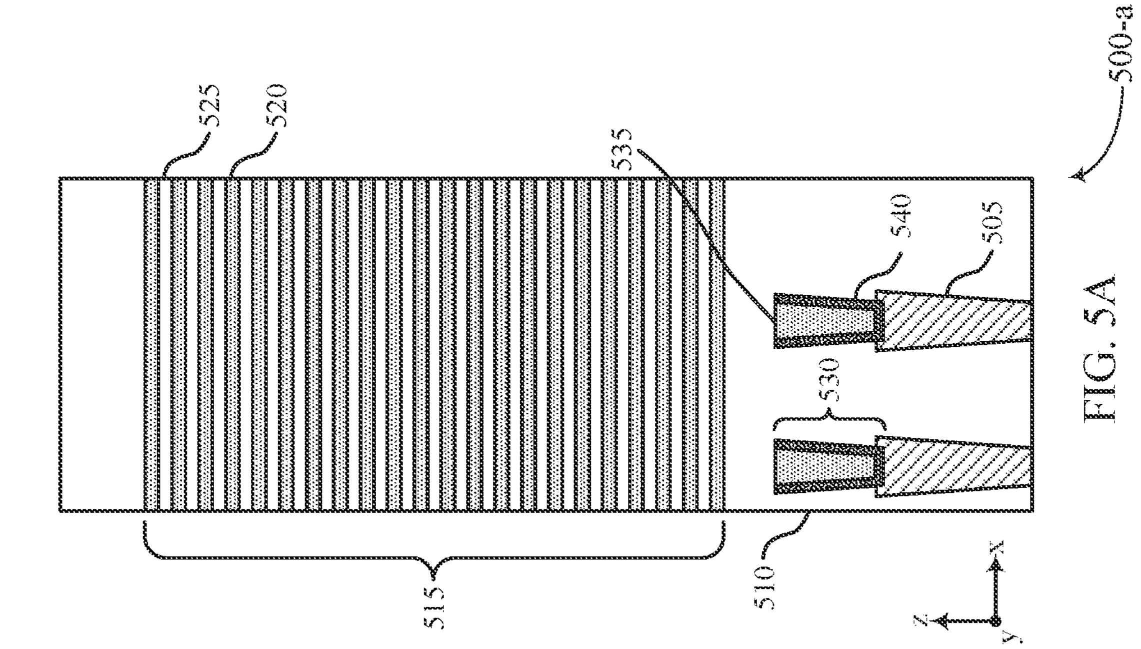

FIG. 5A illustrates a first processing step 500-*a* for forming a stack of materials 515. In some examples, the first processing step 500-*a* may include depositing the stack of materials 515 above (e.g., along the z-direction) a first dielectric material 510 (e.g., an oxide material such as TEOS, a fifth dielectric material), which may be an example of a first dielectric material 415, as described with reference to FIGS. 4A through 4F. The stack of materials 515 may include alternating layers of a second dielectric material 520 and a third dielectric material 525, where the second dielectric material 520 may be a nitride material and the third dielectric material 525 may be an oxide material (e.g., TEOS). In some cases, the stack of materials 515 may have been formed such that each material is generally coplanar in an xy-plane, and the layers may be stacked in the z-direction (e.g., the layers may be formed one above another in the z-direction). In some cases, the layers of the second dielectric material 520 and the third dielectric material 525 may have been formed such that each layer was deposited and plananzed prior to deposition of the subsequent layer.

In some cases, the stack of materials 515 may be formed above bit line plates 505 and plugs 530, which may be examples of bit line plates 410 and plugs 440, as described with reference to FIGS. 4A through 4F, respectively. The bit line plates 505 may include a tungsten material formed above circuitry such as transistors (not shown) and may be utilized when performing access operations on memory cells (e.g., chalcogenide memory cells) of the memory device. The plugs 530 may include a sacrificial material 535 and a liner 540 which may have been formed during one or more prior processing steps, such as one of the processing steps 400 as described with reference to FIGS. 4A through 4F. In some cases, the sacrificial material 535 may be configured to be removed (e.g., exhumed) during a later processing step, and the liner 540 may be associated with protecting the bit line plates 505 from operations at one or more subsequent processing steps 500.

FIG. 5B illustrates a second processing step 500-*b* for forming piers 545. In some examples, the second processing step 500-*b* may include forming cavities (e.g., second cavities) through the stack of materials 515, where the cavities may extend (e.g., along the z-direction) from an upper surface 516 of the stack of materials 515 to a depth that is above an upper surface 506 of the bit line plates 505 and below an upper surface 531 of the plugs 530. The cavities may be located between every plug 530, such that any two plugs 530 may have a cavity between them (e.g., along the x-direction). In some cases, forming the cavities may include performing a dry etching operation to remove portions (e.g., corresponding to the cavities) of the stack of materials 515 and the first dielectric material 510. In some examples, the cavities may be formed with a directional etching process to generally extend in the vertical direction (e.g., along the z-direction). Accordingly, the cavities may be formed such that a width (e.g., in the x-direction) through the cavities may be inversely related to a depth (e.g., along the z-direction) at the cavities (e.g., wider towards the top of the cavities). That is, the cavities may be a generally tapered shape. In some examples, the cavities may be formed such that piers corresponding to the cavities may be electrically isolated from the bit line plates 505 or pillars 570.

In some examples, the second processing step 500-*b* may include depositing one or more materials into the cavities to form the piers 545. The piers 545 may include a liner (e.g., not shown) deposited into the cavities and a fill material deposited into remaining space of the cavities. In some implementations, the liner may be another dielectric material (e.g., a sixth dielectric material, a third dialectic material), such as an oxide material different than the third dielectric material 525, and the fill material may be another dielectric material or a polysilicon material different than the third dielectric material 525.

In some examples, the second processing step 500-*b* may include forming an oxide material 550 above the stack of materials 515. The oxide material 550 may be deposited onto the upper surface 516 of the stack of materials 515. In some implementations, the upper surface 516 of the stack of materials 515 and the piers 545 may be planarized such that portions of the stack of materials 515 and the piers 545 may be removed prior to depositing the oxide material 550.

Figure 5D:
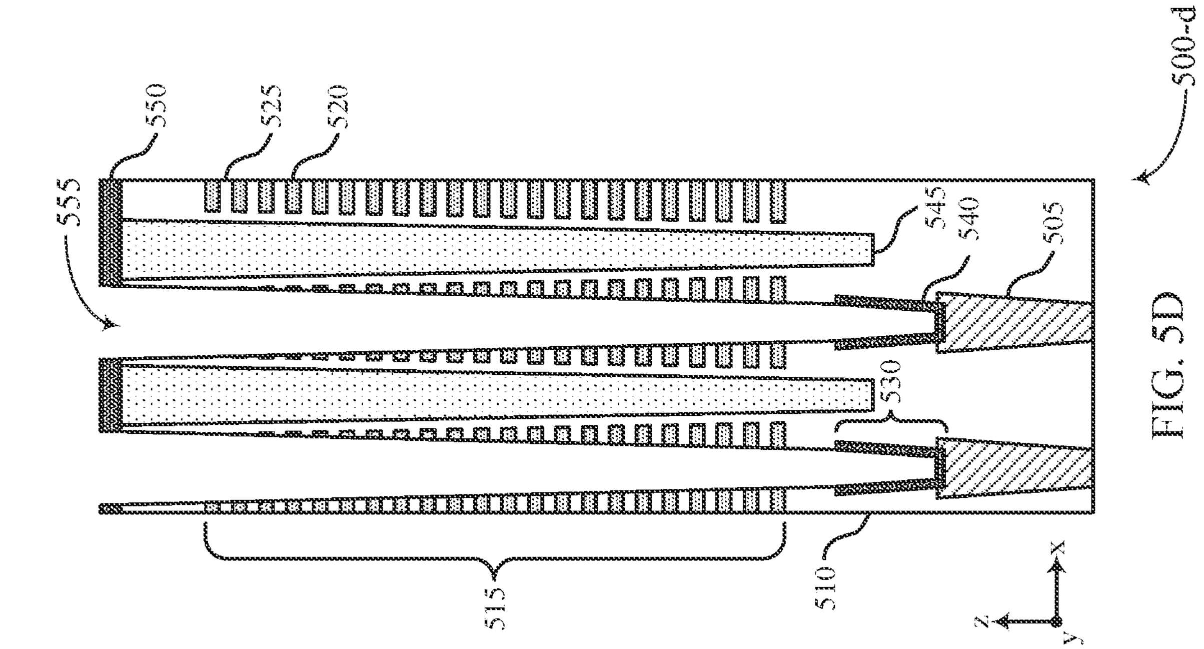
Figure 5C:
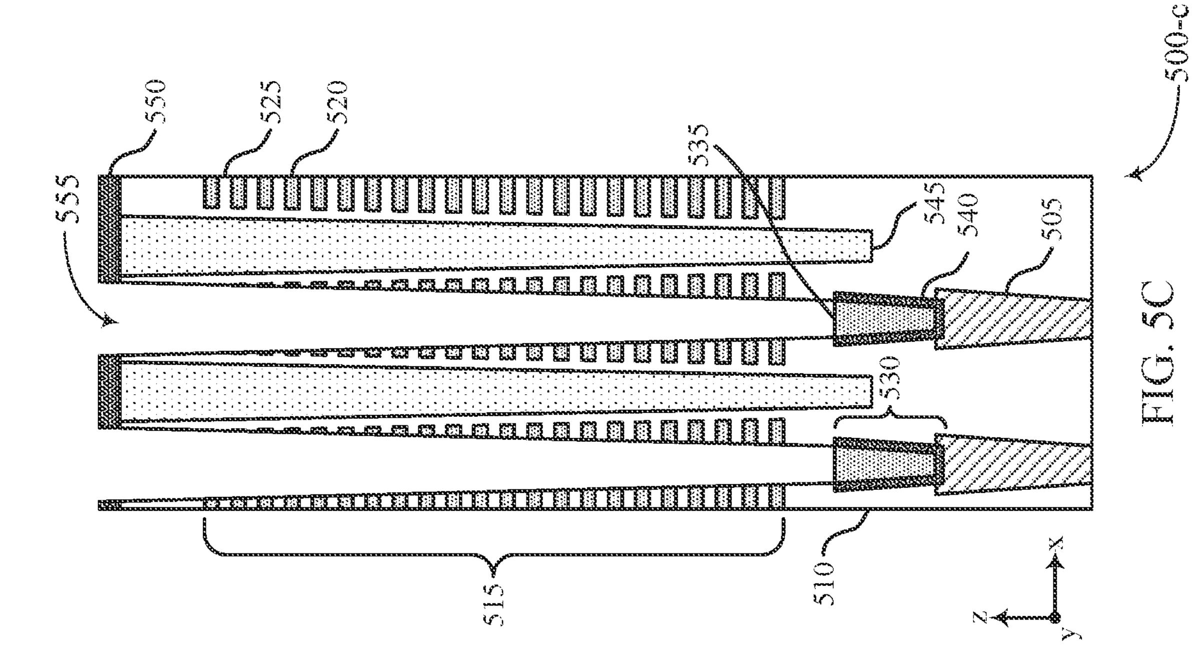

FIG. 5C illustrates a third processing step 500-*c* for forming cavities 555. In some examples, the third processing step 500-*c* may include forming the cavities 555 through the stack of materials 515 and the oxide material 550, where the cavities 555 extend to a depth that is above or in contact with an upper surface of the plugs 530. The cavities 555 may be generally aligned with the plugs 530 (e.g., along the x-direction) such that each cavity 555 is generally above (e.g., centered over) a respective plug 530. In some examples, the cavities 555 may be formed with a directional etching process to generally extend in the vertical direction (e.g., along the z-direction). Accordingly, the cavities 555 may be formed such that a width (e.g., in the x-direction) through the cavities 555 may be inversely related to a depth (e.g., along the z-direction) at the cavities 555 (e.g., wider towards the top of the cavities 555). That is, the cavities 555 may a generally tapered shape.

Forming the cavities 555 may include removing portions (e.g., corresponding to the cavities) of the oxide material 550 and the stack of materials 515 via a dry etch operation. In some implementations, the first dielectric material 510 may be configured to act as a soft stop, such that the dry etch operation may be at least partially resisted by the first dielectric material 510. Further, the first dielectric material 510 may aid in reducing the taper of the shape of the cavity 555 of the plugs 530. The sacrificial material 535 may be configured to act as a hard stop, such that the dry etch operation may be resisted by the sacrificial material 535.

FIG. 5D illustrates a fourth processing step 500-*d* for removing the sacrificial material 535 from the plugs 530. In some examples, the fourth processing step 500-*d* may include exhuming (e.g., removing) the sacrificial material 535 from the plugs 530 via a wet etch operation. The liner 540 may be resistant to the wet etch operation such that the liner 540 may protect the bit line plates 505 from being exhumed by the wet etch operation. In some implementations, exhuming the sacrificial material 535 from the plugs 530 may extend the cavities 555 down to the liner 540 (e.g., along the z-direction). In such implementations, exhuming the sacrificial material 535 may shape the cavities 555 such that a portion of the cavities 555 in the plugs 530 may be tapered. Further, exhuming the sacrificial material 535 may align the cavities 555 with the liner 540.

Figure 5E:
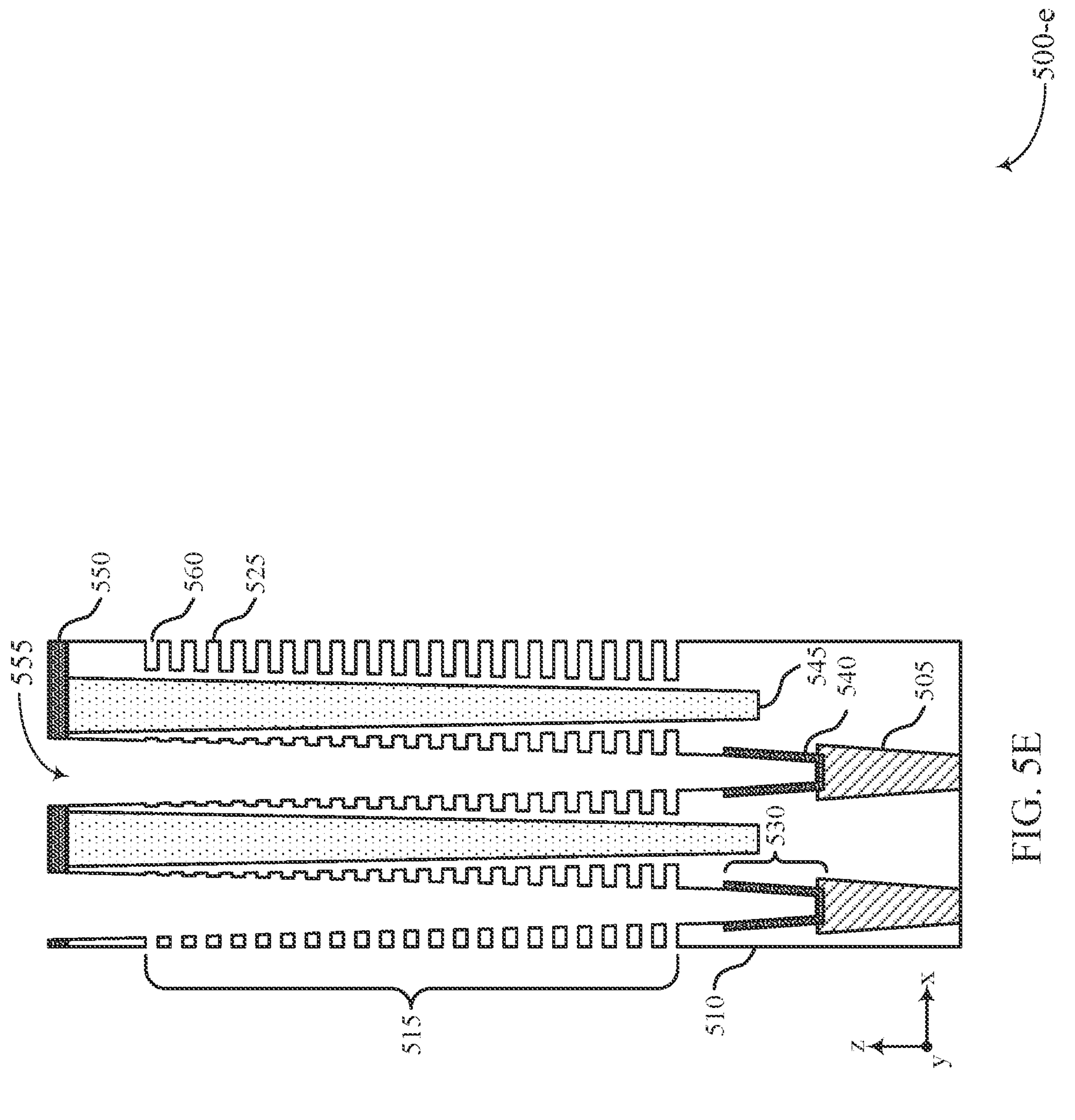

FIG. 5E illustrates a fifth processing step 500-*e* for removing the second dielectric material 520 from the stack of materials 515. In some examples, the fifth processing step 500-*e* may include exhuming the second dielectric material 520 from the stack of materials 515 via a wet etch operation. The third dielectric material 525 may not be exhumed by the wet etch operation. In some implementations, exhuming the second dielectric material 520 may form recesses 560 in between the layers of the third dielectric material 525.

Figure 5F:
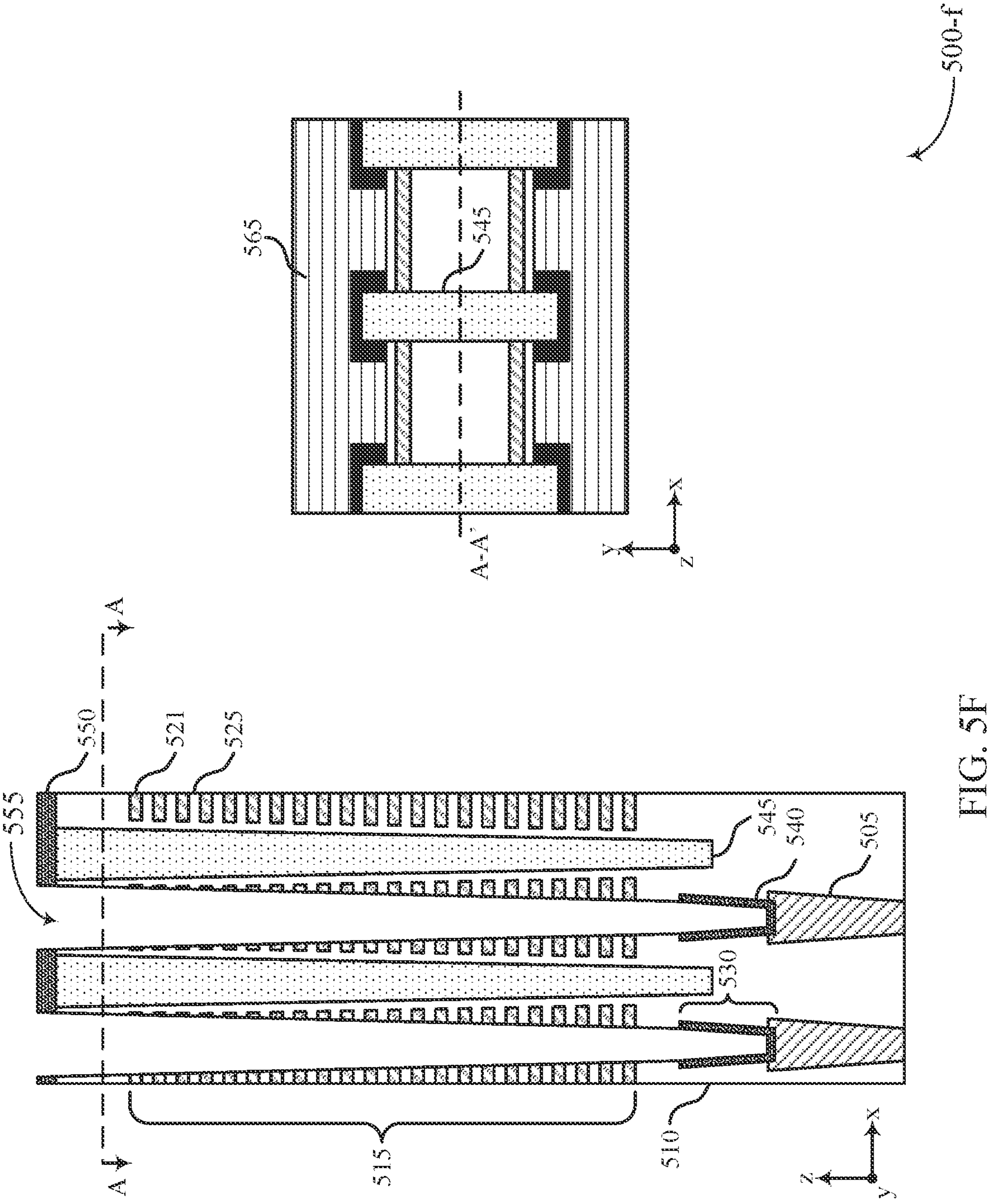

FIG. 5F illustrates a sixth processing step 500-*f* for forming word lines 565. In some examples, the sixth processing step 500-*f* may include forming the word lines 565 in the recesses 560 based on removing the second dielectric material 520 from the stack of materials 515. For example, a conductive material (e.g., a first conductive material, a tungsten material) may be deposited into the recesses 560 to form the word lines 565. In some implementations, depositing the conductive material into the recesses 560 may be associated with a metallization operation. In some instances, portions of the word lines 565 extending into the cavities 555 may be removed after depositing the conductive material.

For example, the sixth processing step 500-*f* may include one or more additional manufacturing operations that are not shown. In some cases, the sixth processing step 500-*f* may include depositing a conductive material (e.g., a first conductive material, a tungsten material) into the cavities 555, recesses 560, or both and forming (e.g., re-forming) at least a portion of the recesses 560 after depositing the conductive material. To form (e.g., reform) at least a portion of the recesses 560, at least a portion of the conductive material may be etched, which may result in the formation of the word lines 565 extending in the x-direction in cross-sections offset from cross-section A-A'. In some examples, the first conductive material may still exist in the recesses 560 along a cross section perpendicular to cross-section A-A'. Accordingly, the word lines 565 may exist between one or more cavities 555 in the y-direction. The sixth processing step 500-*f* may also include depositing a first electrode material into the cavities 555 after removing the portion of the conductive material to form the word line 565. At least a portion of the first electrode material may be removed such that the first electrode material may be located in the portion of the recesses 560 that extend along a cross section perpendicular to cross-section A-A' (e.g., between the cavities 555 and the word lines 565). The sixth processing step 500-*f* may also include depositing a second dielectric material 521 (e.g., a nitride material 521) into the cavities 555 after removing the portion of the first electrode material. At least a portion of the second dielectric material 521 may be removed such that the second dielectric material 521 may be located in portions of the recesses 560 that extend along a cross section perpendicular to cross-section A-A' (e.g., between the cavities 555 and the word lines 565). Portions of the second dielectric material 521 may be used as a place-holder for a memory material and may be removed in one or more additional processing steps.

Figure 5G:
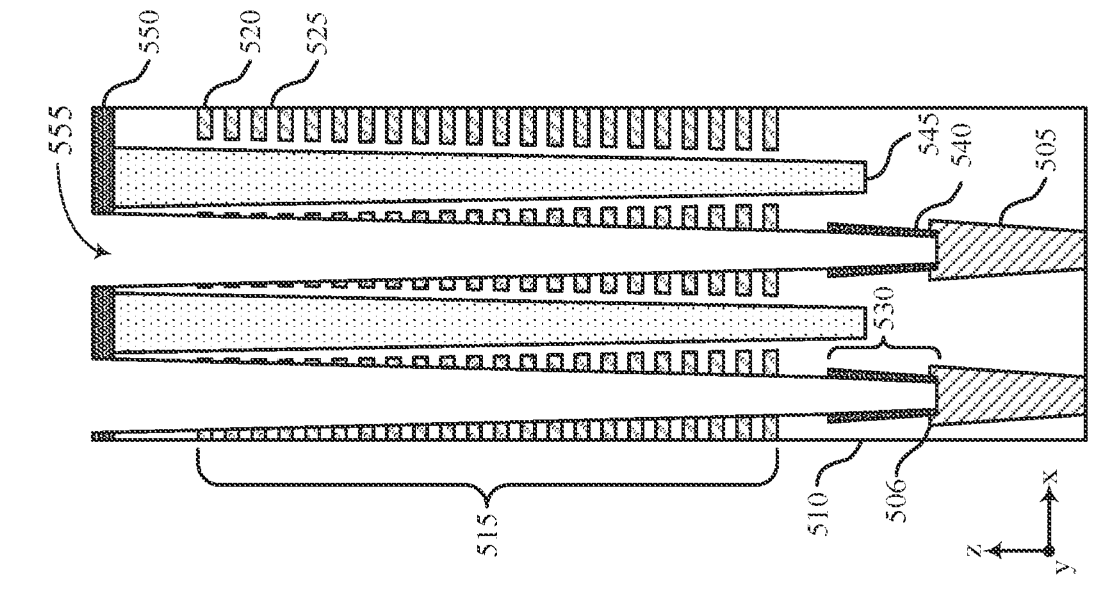

FIG. 5G illustrates a seventh processing step 500-*g* for removing portions of the liner 540. In some examples, the seventh processing step 500-*g* may include removing a bottom portion of the liner 540 in each plug 530 via a dry etch operation. Removing the bottom portion of the liner 540 may extend the cavities 555 to the upper surface 506 of the bit line plates 505 (e.g., along the z-direction). In some implementations, sidewalls of the liner 540 may remain in contact with the upper surface 506 of the bit line plates 505 after performing the dry etch operation. Additionally or alternatively, the seventh processing step 500-*g* may include one or more additional manufacturing operations that are not shown. For example, after removing portions of the liner 540, an electrode material may be deposited into the cavities 555, which may result in the formation of a second electrode.

Figure 5H:
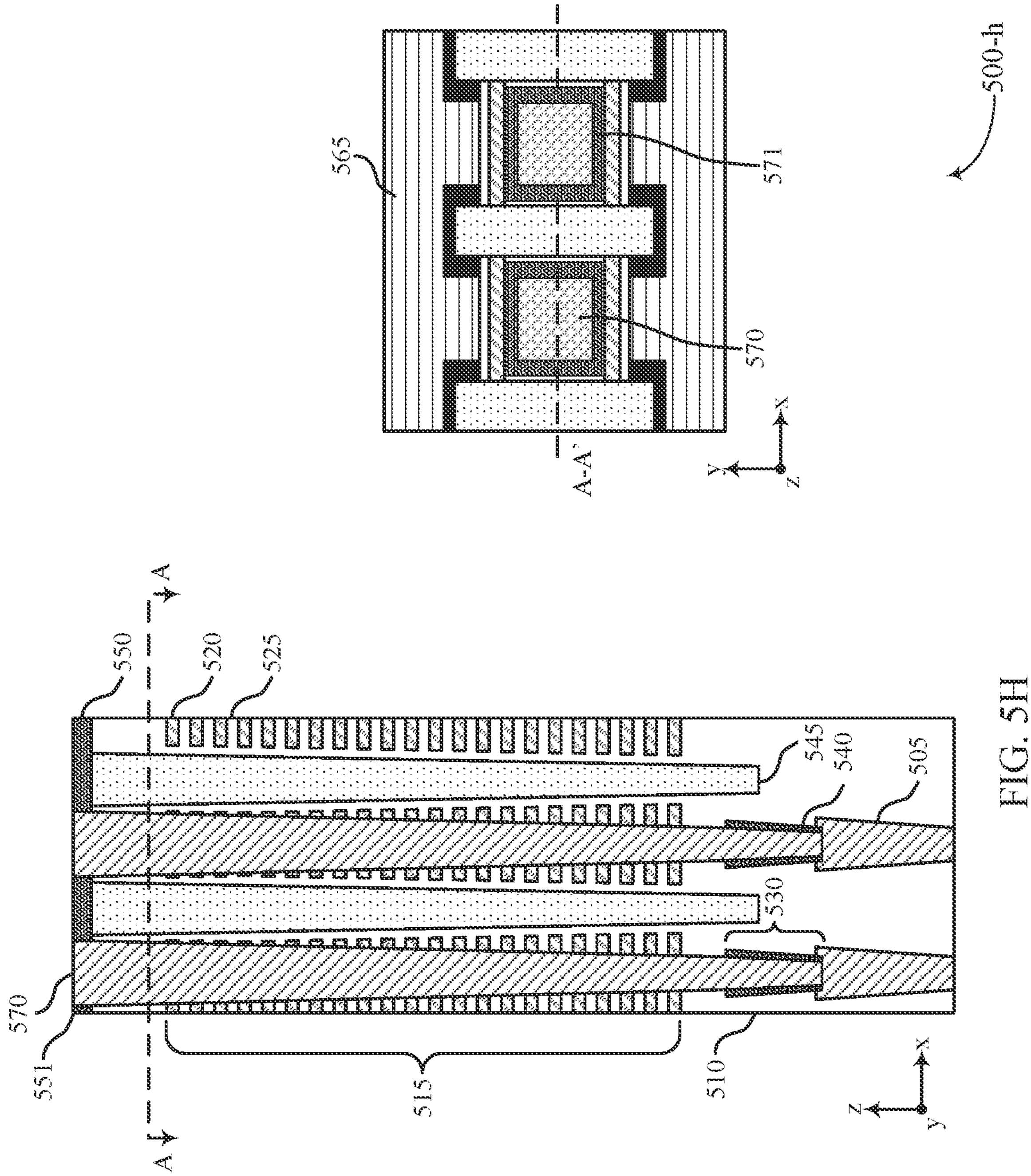

FIG. 5H illustrates an eighth processing step 500-*h* for forming the pillars 570. In some examples, the eighth processing step 500-*h* may include forming the pillars 570 in the cavities 555 by depositing another conductive material (e.g., a second conductive material, a tungsten material) into the cavities 555, such that the cavities 555 are filled by the conductive material. In some instances, the conductive material of the word lines 565 may be a same material as the conductive material of the pillars 370. In some implementations, the pillars 570 may be planarized such that the conductive material is coplanar to an upper surface 551 of the oxide material 550.

In some instances, prior to depositing the conductive material into the cavities 555, an electrode material 571 may be deposited into each of the cavities 555 to form one or more electrodes (not shown in the plan view in FIG. 5H). After the electrode material 571 is deposited the conductive material may be deposited into the cavities 555 (such that the cavities are filled with the electrode material 571 and the conductive material) to form the pillar 570. Accordingly, one or more sides of each pillar 570 may be in contact with the electrode material 571.

After the pillars 570 are formed, each pillar 570 may be in contact with a respective bit line plate 505 and an electrode (e.g., a bottom electrode). In some examples, the pillars 570 may be in contact with remaining portions of the liner 540 at the sidewalls of the pillars 570. Additionally or alternatively, the word line 565 may be in contact with another electrode (e.g., a top electrode).

In some cases, at subsequent processing steps 500 of forming the memory device, chalcogenide memory cells may be formed. The chalcogenide memory cells may be formed via accessing the stack of materials 515 via a subset of piers 545. For example, the liner or the fill material or both may be removed from the subset of piers 545, where the subset of piers 545 may include every other pier 545 of the piers 545 (e.g., a pattern of pier, pillar, exhumed pier, pillar, pier, pillar, exhumed pier, pillar, etc.). Removing one or more materials from the subset of piers 545 may enable one or more manufacturing operations to form the chalcogenide memory cells. For example, forming the chalcogenide memory cells may include removing the second dielectric material 520 from the recesses 560 and forming the chalcogenide memory material between the pillars 570 and the word lines 565, such that the chalcogenide memory material is coupled with the bit line plates 505 via a respective pillar 570 (e.g., and electrode material 571, if present). In some examples, the chalcogenide memory cells may be coupled with the pillars 570 and respective word lines 565.

In accordance with examples as described herein, the processing steps 500 may form the pillars 570 and the piers 545 with the use of plugs 530, which may prevent or mitigate damage to the bit line plates 505 in subsequent manufacturing operations. For example, during the formation of the pillars 570, the plugs 530 may prevent the manufacturing operations from contacting the bit line plates 505. Additionally, the manufacturing operations described herein with reference to FIGS. 5A through 5H may result in the pillars 570.

Figure 6:
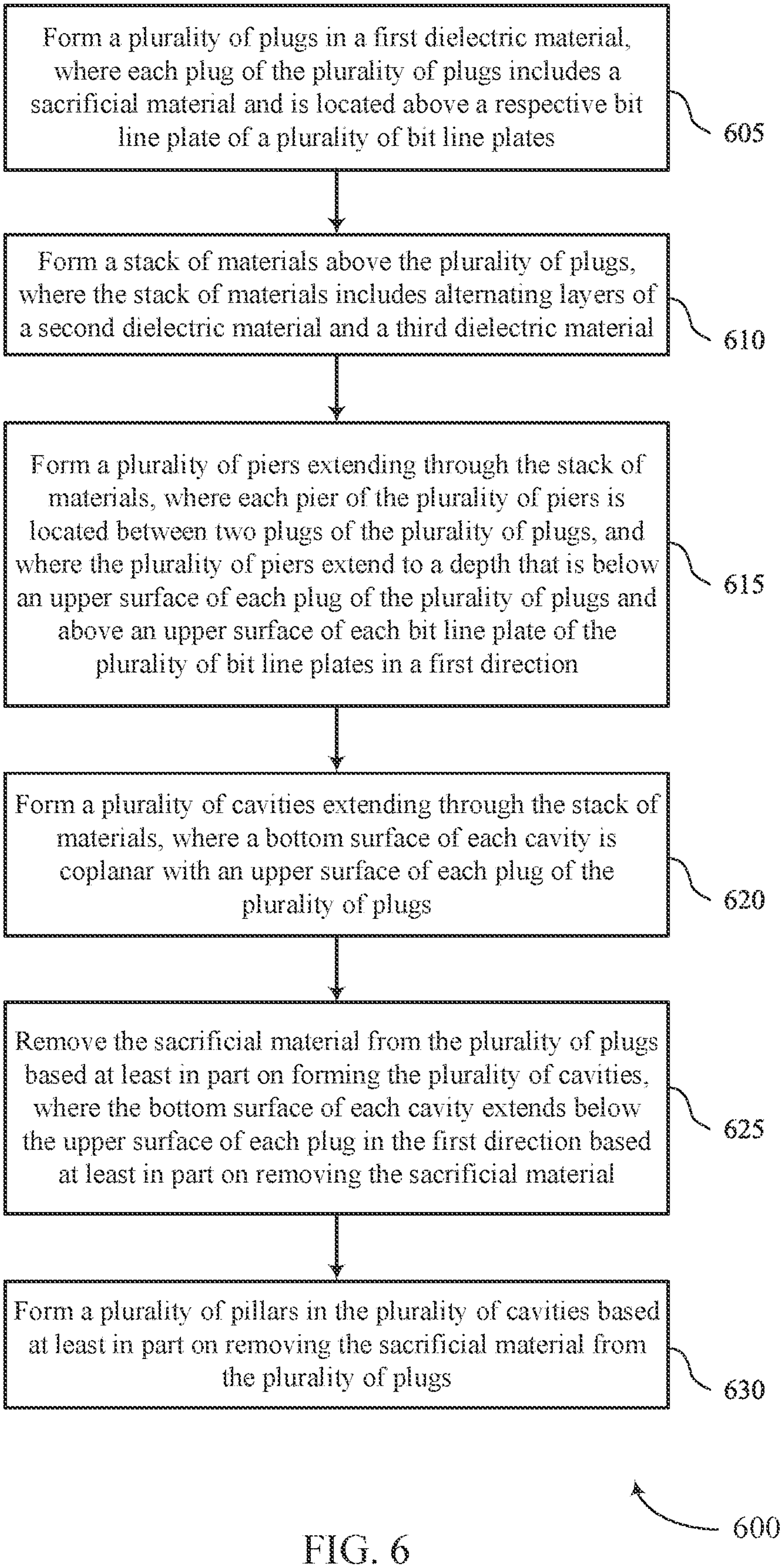
FIG. 6 illustrates a flowchart showing a method or methods that support a single plug flow for a memory device in accordance with examples as disclosed herein.

FIG. 6 illustrates a flowchart showing a method or methods 600 that supports a single plug flow for a memory device in accordance with examples as disclosed herein. The operations of method 600 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 605, the method may include forming a plurality of plugs in a first dielectric material, where each plug of the plurality of plugs includes a sacrificial material and is located above a respective bit line plate of a plurality of bit line plates. The operations of 605 may be performed in accordance with examples as disclosed herein.

At 610, the method may include forming a stack of materials above the plurality of plugs, where the stack of materials includes alternating layers of a second dielectric material and a third dielectric material. The operations of 610 may be performed in accordance with examples as disclosed herein.

At 615, the method may include forming a plurality of piers extending through the stack of materials, where each pier of the plurality of piers is located between two plugs of the plurality of plugs, and where the plurality of piers extend to a depth that is below an upper surface of each plug of the plurality of plugs and above an upper surface of each bit line plate of the plurality of bit line plates in a first direction. The operations of 615 may be performed in accordance with examples as disclosed herein.

At 620, the method may include forming a plurality of cavities extending through the stack of materials, where a bottom surface of each cavity is coplanar with an upper surface of each plug of the plurality of plugs. The operations of 620 may be performed in accordance with examples as disclosed herein.

At 625, the method may include removing the sacrificial material from the plurality of plugs based at least in part on forming the plurality of cavities, where the bottom surface of each cavity extends below the upper surface of each plug in the first direction based at least in part on removing the sacrificial material. The operations of 625 may be performed in accordance with examples as disclosed herein.

At 630, the method may include forming a plurality of pillars in the plurality of cavities based at least in part on removing the sacrificial material from the plurality of plugs. The operations of 630 may be performed in accordance with examples as disclosed herein.

In some examples, an apparatus (e.g., a manufacturing system) as described herein may perform a method or methods, such as the method 600. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming a plurality of plugs in a first dielectric material, where each plug of the plurality of plugs includes a sacrificial material and is located above a respective bit line plate of a plurality of bit line plates; forming a stack of materials above the plurality of plugs, where the stack of materials includes alternating layers of a second dielectric material and a third dielectric material; forming a plurality of piers extending through the stack of materials, where each pier of the plurality of piers is located between two plugs of the plurality of plugs, and where the plurality of piers extend to a depth that is below an upper surface of each plug of the plurality of plugs and above an upper surface of each bit line plate of the plurality of bit line plates in a first direction; forming a plurality of cavities extending through the stack of materials, where a bottom surface of each cavity is coplanar with an upper surface of each plug of the plurality of plugs; removing the sacrificial material from the plurality of plugs based at least in part on forming the plurality of cavities, where the bottom surface of each cavity extends below the upper surface of each plug in the first direction based at least in part on removing the sacrificial material; and forming a plurality of pillars in the plurality of cavities based at least in part on removing the sacrificial material from the plurality of plugs.

Aspect 2: The method or apparatus of aspect 1, where forming the plurality of plugs includes operations, features, circuitry, logic, means, or instructions, or any combination thereof for depositing the first dielectric material; depositing a plananzation stop material above the first dielectric material; and removing a portion of the first dielectric material and the planarization stop material.

Aspect 3: The method or apparatus of aspect 2, further including operations, features, circuitry, logic, means, or instructions, or any combination thereof for depositing a liner based at least in part on removing the portion of the first dielectric material and the planarization stop material, where a portion of the liner is in contact with an upper surface of the planarization stop material and the upper surface of each bit line plate of the plurality of bit line plates, where the liner includes a fourth dielectric material.

Aspect 4: The method or apparatus of aspect 3, where removing the sacrificial material from the plurality of plugs further includes operations, features, circuitry, logic, means, or instructions, or any combination thereof for removing a portion of the liner in contact with the upper surface of each bit line plate of the plurality of bit line plates.

Aspect 5: The method or apparatus of aspects 3 through 4, further including operations, features, circuitry, logic, means, or instructions, or any combination thereof for depositing the sacrificial material based at least in part on depositing the liner and removing at a portion of the sacrificial material based at least in part on depositing the sacrificial material, where an upper surface of the sacrificial material is coplanar with an upper surface of the planarization stop material based at least in part on removing the portion of the sacrificial material.

Aspect 6: The method or apparatus of aspect 5, further including operations, features, circuitry, logic, means, or instructions, or any combination thereof for depositing a fifth dielectric material based at least in part on removing the portion of the sacrificial material, where the stack of materials is formed above the fifth dielectric material.

Aspect 7: The method or apparatus of aspect 6, where forming the stack of materials includes operations, features, circuitry, logic, means, or instructions, or any combination thereof for depositing the alternating layers of the second dielectric material and the third dielectric material, where the second dielectric material and the third dielectric material are deposited above the fifth dielectric material.

Aspect 8: The method or apparatus of aspects 1 through 7, where at least a portion of each plug of the plurality of plugs is aligned with a respective bit line plate of the plurality of bit line plates in a second direction.

Aspect 9: The method or apparatus of aspects 1 through 8, where forming the plurality of piers includes operations, features, circuitry, logic, means, or instructions, or any combination thereof for forming a plurality of second cavities extending through the stack of materials and depositing one or more materials in the plurality of second cavities to form the plurality of piers, where at least an outer portion of each of the plurality of piers includes a sixth dielectric material.

Aspect 10: The method or apparatus of aspect 9, further including operations, features, circuitry, logic, means, or instructions, or any combination thereof for removing at least a portion of one or more materials from one or more piers of the plurality of piers and forming a plurality of memory cells between the plurality of pillars and a plurality of word lines based at least in part on removing at least the portion of the one or more materials from the one or more piers of the plurality of piers, where the plurality of memory cells each include a chalcogenide memory material and are each coupled with at least one bit line plate of the plurality of bit line plates.

Aspect 11: The method or apparatus of aspects 1 through 10, further including operations, features, circuitry, logic, means, or instructions, or any combination thereof for removing the layers of the second dielectric material from the stack of materials based at least in part on removing the sacrificial material from the plurality of plugs and forming a plurality of word lines based at least in part on removing the layers of the second dielectric material from the stack of materials, where each word line is formed in a recess that is adjacent to at least one layer of the third dielectric material.

Aspect 12: The method or apparatus of aspect 11, where forming the plurality of word lines includes operations, features, circuitry, logic, means, or instructions, or any combination thereof for depositing a first conductive material in each recess.

Aspect 13: The method or apparatus of aspects 1 through 12, where forming the plurality of pillars includes operations, features, circuitry, logic, means, or instructions, or any combination thereof for depositing a second conductive material in each cavity of the plurality of cavities.

Aspect 14: The method or apparatus of aspects 1 through 13, where the sacrificial material includes aluminum oxide.

Aspect 15: The method or apparatus of aspects 1 through 14, where each pillar is in contact with a respective bit line plate of the plurality of bit line plates.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 16: An apparatus, including: a plurality of bit line plates; a stack of materials located above the plurality of bit line plates, the stack of materials including alternating layers of a dielectric material and respective word lines of a plurality of word lines, where each word line of the plurality of word lines includes a conductive material; a plurality of pillars extending through the stack of materials, where each pillar of the plurality of pillars is in contact with a respective bit line plate of the plurality of bit line plates, and where the plurality of pillars include a conductive material; a liner in contact with one or more sidewalls of each pillar; and a plurality of piers extending through the stack of materials, where each pier of the plurality of piers is electrically isolated from each pillar of the plurality of pillars.

Aspect 17: The apparatus of aspect 16, further including: a plurality of chalcogenide memory cells coupled with the plurality of pillars and a respective word line of the plurality of word lines.

Aspect 18: The apparatus of any of aspects 16 through 17, further including: a plurality of transistors, where each transistor of the plurality of transistors is coupled with a respective bit line plate of the plurality of bit line plates.

Aspect 19: The apparatus of any of aspects 16 through 18, where at least a portion of each pier of the plurality of piers includes a second dielectric material.

Aspect 20: The apparatus of any of aspects 16 through 19, where the liner includes a third dielectric material different than the dielectric material.

An apparatus is described. The following provides an overview of aspects of the apparatus as described herein:

Aspect 21: An apparatus, including: a plurality of bit line plates; a stack of materials located above the plurality of bit line plates, the stack of materials including alternating layers of a dielectric material and a respective word line of a plurality of word lines, where each word line of the plurality of word lines includes a conductive material; a plurality of pillars extending through the stack of materials, where each pillar of the plurality of pillars is in contact with a respective bit line plate of the plurality of bit line plates, where a portion of each pillar includes a liner on one or more sidewalls; and a plurality of chalcogenide memory cells coupled between a pillar of the plurality of pillars and respective word lines of the plurality of word lines.

Aspect 22: The apparatus of aspect 21, further including: a plurality of piers extending through the stack of materials, where the plurality of piers include one or more materials that are different than a material included by the plurality of pillars.

Aspect 23: The apparatus of aspect 22, where at least a portion of the plurality of piers include a second dielectric material, and for a pier of the plurality of piers, the second dielectric material is in contact with a chalcogenide memory material of the plurality of chalcogenide memory cells.

Aspect 24: The apparatus of any of aspects 21 through 23, further including: a plurality of transistors, where each transistor of the plurality of transistors is coupled with a respective bit line plate of the plurality of bit line plates.

Aspect 25: The apparatus of any of aspects 21 through 24, where the liner includes a second dielectric material different than the dielectric material.

An apparatus is described. The following provides an overview of aspects of the apparatus as described herein:

Aspect 26: An apparatus, including: a plurality of bit line plates; a stack of materials located above the plurality of bit line plates, the stack of materials including alternating layers of a dielectric material and a respective word line of a plurality of word lines, where each word line of the plurality of word lines includes a conductive material; a plurality of pillars extending through the stack of materials, where each pillar of the plurality of pillars is in contact with a respective bit line plate of the plurality of bit line plates, where a portion of each pillar includes a liner on one or more sidewalls and is formed by: forming a plurality of plugs including a sacrificial material, where each plug of the plurality of plugs is located above a respective bit line plate of the plurality of bit line plates; forming a plurality of cavities extending through the stack of materials, where a bottom surface of each cavity is coplanar with an upper surface of each plug of the plurality of plugs; removing a sacrificial material from the plurality of plugs based at least in part on forming the plurality of cavities, where the bottom surface of each cavity extends below the upper surface of each plug in a first direction based at least in part on removing the sacrificial material; and depositing a conductive material in each cavity of the plurality of cavities based at least in part on removing the sacrificial material from the plurality of plugs; and a plurality of chalcogenide memory cells in contact with at least a respective word line of the plurality of word lines.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

forming a plurality of plugs in a first dielectric material, wherein each plug of the plurality of plugs comprises a sacrificial material and is located above a respective bit line plate of a plurality of bit line plates;

forming a stack of materials above the plurality of plugs, wherein the stack of materials comprises alternating layers of a second dielectric material and a third dielectric material;

forming a plurality of piers extending through the stack of materials, wherein each pier of the plurality of piers is located between two plugs of the plurality of plugs, and wherein the plurality of piers extend to a depth that is below an upper surface of each plug of the plurality of plugs and above an upper surface of each bit line plate of the plurality of bit line plates in a first direction;

forming a plurality of cavities extending through the stack of materials, wherein a bottom surface of each cavity is coplanar with an upper surface of each plug of the plurality of plugs;

removing the sacrificial material from the plurality of plugs based at least in part on forming the plurality of cavities, wherein the bottom surface of each cavity extends below the upper surface of each plug in the first direction based at least in part on removing the sacrificial material; and forming a plurality of pillars in the plurality of cavities based at least in part on removing the sacrificial material from the plurality of plugs.

2. The method of claim 1, wherein forming the plurality of plugs comprises:

depositing the first dielectric material;

depositing a planarization stop material above the first dielectric material; and removing a portion of the first dielectric material and the planarization stop material.

3. The method of claim 2, further comprising:

depositing a liner based at least in part on removing the portion of the first dielectric material and the planarization stop material, wherein a portion of the liner is in contact with an upper surface of the planarization stop material and the upper surface of each bit line plate of the plurality of bit line plates, wherein the liner comprises a fourth dielectric material.

4. The method of claim 3, wherein removing the sacrificial material from the plurality of plugs further comprises:

removing a portion of the liner in contact with the upper surface of each bit line plate of the plurality of bit line plates.

5. The method of claim 3, further comprising:

depositing the sacrificial material based at least in part on depositing the liner; and removing at a portion of the sacrificial material based at least in part on depositing the sacrificial material, wherein an upper surface of the sacrificial material is coplanar with an upper surface of the planarization stop material based at least in part on removing the portion of the sacrificial material.

6. The method of claim 5, further comprising:

depositing a fifth dielectric material based at least in part on removing the portion of the sacrificial material, wherein the stack of materials is formed above the fifth dielectric material.

7. The method of claim 6, wherein forming the stack of materials comprises:

depositing the alternating layers of the second dielectric material and the third dielectric material, wherein the second dielectric material and the third dielectric material are deposited above the fifth dielectric material.

8. The method of claim 1, wherein at least a portion of each plug of the plurality of plugs is aligned with a respective bit line plate of the plurality of bit line plates in a second direction.

9. The method of claim 1, wherein forming the plurality of piers comprises:
forming a plurality of second cavities extending through the stack of materials; and
depositing one or more materials in the plurality of second cavities to form the plurality of piers, wherein at least an outer portion of each of the plurality of piers comprises a sixth dielectric material.

10. The method of claim 9, further comprising:
removing at least a portion of one or more materials from one or more piers of the plurality of piers; and
forming a plurality of memory cells between the plurality of pillars and a plurality of word lines based at least in part on removing at least the portion of the one or more materials from the one or more piers of the plurality of piers, wherein the plurality of memory cells each comprise a chalcogenide memory material and are each coupled with at least one bit line plate of the plurality of bit line plates.

11. The method of claim 1, further comprising:
removing the layers of the second dielectric material from the stack of materials based at least in part on removing the sacrificial material from the plurality of plugs; and
forming a plurality of word lines based at least in part on removing the layers of the second dielectric material from the stack of materials, wherein each word line is formed in a recess that is adjacent to at least one layer of the third dielectric material.

12. The method of claim 1, wherein each pillar is in contact with a respective bit line plate of the plurality of bit line plates.

13. An apparatus, comprising:
a plurality of bit line plates;
a stack of materials located above the plurality of bit line plates, the stack of materials comprising alternating layers of a dielectric material and respective word lines of a plurality of word lines, wherein each word line of the plurality of word lines comprises a conductive material;
a plurality of pillars extending through the stack of materials, wherein each pillar of the plurality of pillars is in contact with a respective bit line plate of the plurality of bit line plates, and wherein the plurality of pillars comprise a conductive material;
a liner in contact with a portion of one or more sidewalls of each pillar, the liner having an upper width greater than a lower width of the liner; and
a plurality of piers extending through the stack of materials.

14. The apparatus of claim 13, further comprising:
a plurality of chalcogenide memory cells coupled with the plurality of pillars and a respective word line of the plurality of word lines.

15. The apparatus of claim 13, further comprising:
a plurality of transistors, wherein each transistor of the plurality of transistors is coupled with a respective bit line plate of the plurality of bit line plates.

16. The apparatus of claim 13, wherein at least a portion of each pier of the plurality of piers comprises a second dielectric material.

17. An apparatus, comprising:
a plurality of bit line plates;
a stack of materials located above the plurality of bit line plates, the stack of materials comprising alternating layers of a dielectric material and a respective word line of a plurality of word lines, wherein each word line of the plurality of word lines comprises a conductive material;
a plurality of pillars extending through the stack of materials, wherein each pillar of the plurality of pillars is in contact with a respective bit line plate of the plurality of bit line plates, wherein a portion of each pillar comprises a liner on one or more sidewalls, the liner having an upper width greater than a lower width of the liner; and
a plurality of chalcogenide memory cells coupled between a pillar of the plurality of pillars and respective word lines of the plurality of word lines.

18. The apparatus of claim 17, further comprising:
a plurality of piers extending through the stack of materials, wherein the plurality of piers comprise one or more materials that are different than a material comprised by the plurality of pillars.

19. The apparatus of claim 18, wherein at least a portion of the plurality of piers comprise a second dielectric material, and wherein for a pier of the plurality of piers, the second dielectric material is in contact with a chalcogenide memory material of the plurality of chalcogenide memory cells.

20. The apparatus of claim 17, further comprising:
a plurality of transistors, wherein each transistor of the plurality of transistors is coupled with a respective bit line plate of the plurality of bit line plates.

* * * * *